United States Patent
Nagatomo et al.

(10) Patent No.: US 7,019,975 B2
(45) Date of Patent: Mar. 28, 2006

(54) POWER MODULE AND POWER MODULE WITH HEAT SINK

(75) Inventors: Yoshiyuki Nagatomo, Gotenba (JP); Toshiyuki Nagase, Gotenba (JP); Shoichi Shimamura, Gotenba (JP)

(73) Assignee: Mitsubishi Materials Corporation, Tokyo (JP)

( * ) Notice: Subject to any disclaimer, the term of this patent is extended or adjusted under 35 U.S.C. 154(b) by 294 days.

(21) Appl. No.: 10/343,857

(22) PCT Filed: Aug. 9, 2001

(86) PCT No.: PCT/JP01/06854

§ 371 (c)(1),
(2), (4) Date: Jun. 27, 2003

(87) PCT Pub. No.: WO02/13267

PCT Pub. Date: Feb. 14, 2002

(65) Prior Publication Data

US 2004/0022029 A1  Feb. 5, 2004

(30) Foreign Application Priority Data

Aug. 9, 2000 (JP) ............................. 2000-240580
Jun. 27, 2001 (JP) ............................. 2001-194034

(51) Int. Cl.
*H05K 7/20* (2006.01)

(52) U.S. Cl. ...................... 361/704; 361/707; 361/708; 361/699; 428/545; 257/703; 257/706

(58) Field of Classification Search ................ 361/699, 361/704, 705, 707–711, 713, 715, 717–719; 165/80.3, 80.4, 185; 174/252, 256, 258; 257/706, 712–714; 428/901, 209, 210

See application file for complete search history.

(56) References Cited

U.S. PATENT DOCUMENTS 5,395,679 A  *  3/1995  Myers et al. ................ 428/209

(Continued)

FOREIGN PATENT DOCUMENTS

CN  378267 A1  1/2000

(Continued)

OTHER PUBLICATIONS

U.S. Appl. No. 10/743,081.

(Continued)

*Primary Examiner*—Boris Chérvinsky
(74) *Attorney, Agent, or Firm*—Rader, Fishman & Grauer PLLC

(57) ABSTRACT

The present invention relates to a power module in which an insulated circuit board is fixed to one main surface of a heat discharge plate. It is an object thereof to provide a power module in which the heat discharge characteristics are improved without any marked warping being generated, and that has an extended heat cycle longevity.

In the power module 10 of the present invention, a square insulated circuit board 12 is fixed to one main surface of a heat discharge plate 11. The heat discharge plate 11 is formed of an Al based alloy plate having a thickness A of 3 to 10 mm, and the insulated circuit board 12 having a side B of 30 mm or less in length is brazed directly onto the heat discharge plate 11. It is preferable that the brazing material used is one or two or more brazing materials selected from Al—Si, Al—Ge, Al—Cu, Al—Mg, and Al—Mn based brazing materials. It is also preferable that the insulated circuit board 12 is formed by a ceramic substrate 12a and Al plates 12b and 12c that are bonded to both surfaces thereof, and that the Al plate 12b has a purity of 99.98 or greater percent by weight.

9 Claims, 5 Drawing Sheets

U.S. PATENT DOCUMENTS

| | | | | |
|---|---|---|---|---|
| 5,621,243 | A | * | 4/1997 | Baba et al. .................. 257/712 |
| 5,892,279 | A | * | 4/1999 | Nguyen ...................... 257/712 |
| 5,920,119 | A | * | 7/1999 | Tamba et al. ................ 257/718 |
| 5,928,768 | A | * | 7/1999 | Ikeda et al. ................. 428/210 |
| 6,033,787 | A |  | 3/2000 | Nagase et al. |
| 6,054,762 | A | * | 4/2000 | Sakuraba et al. ............ 257/703 |
| 6,055,154 | A | * | 4/2000 | Azar ........................... 361/688 |
| 6,060,772 | A | * | 5/2000 | Sugawara et al. .......... 257/678 |
| 6,201,696 | B1 | * | 3/2001 | Shimizu et al. ............. 361/704 |
| 6,261,703 | B1 | * | 7/2001 | Sasaki et al. ................ 428/627 |
| 6,309,737 | B1 | * | 10/2001 | Hirashima et al. .......... 428/210 |
| 6,310,775 | B1 |  | 10/2001 | Nagatomo et al. |
| 6,483,185 | B1 |  | 11/2002 | Nagase et al. |
| 6,563,709 | B1 |  | 5/2003 | Negishi et al. |

FOREIGN PATENT DOCUMENTS

| | | |
|---|---|---|
| GB | 2 337 162 A1 | 11/1999 |
| JP | 03-125463 A1 | 5/1991 |
| JP | 10-065075 A1 | 3/1998 |
| JP | 11-220073 A1 | 8/1999 |
| JP | 11-317482 A1 | 11/1999 |
| JP | 2000-077583 A1 | 3/2000 |
| WO | WO99/34438 A1 | 7/1999 |

OTHER PUBLICATIONS

A copy of International Search Report of PCT/JP01/06854 mailed on Nov. 13, 2001.

* cited by examiner

POWER MODULE AND POWER MODULE WITH HEAT SINK

BACKGROUND OF THE INVENTION

1. Field of the Invention

The present invention relates to a power module in which an insulated circuit board is fixed to one main surface of a heat discharge plate.

This application is based on Patent Application Nos. 2000-240580 and 2001-194034 filed in Japan, the contents of which are incorporated herein by reference.

2. Background Art

As is shown in FIG. 5A, a power module 1 of this type is known in which an insulated circuit board 3 is fixed to one main surface of a heat discharge plate 2. The insulated circuit board 3 is manufactured by bonding first and second aluminum (Al) plates 3b and 3c to both surfaces of a ceramic substrate 3a. The second Al plate 3c of the insulated circuit board 3 is formed by etching as a circuit having a predetermined pattern, and a semiconductor chip 4 or the like shown by the dotted chain line is mounted thereon. The first Al plate 3b of the insulated circuit board 3 is bonded to a top surface of the heat discharge plate 2 that is formed of an aluminum based alloy via a stress cushioning layer 6 that is formed of an AlSiC composite material, and if required the heat discharge plate 2 can be mounted on a heat sink (not shown). In this conventional power module 1 heat generated by the semiconductor chip 4 or the like is transmitted to the heat discharge plate 2 via the second Al plate 3c, the ceramic substrate 3a, the first Al plate 3b, and the stress cushioning layer 6. Thereafter, this heat is dissipated from the heat discharge plate 2 or the unillustrated heat sink on which the heat discharge plate 2 is mounted.

In order for the heat generated by the mounted semiconductor chip 4 or the like to be dissipated in the power module 1, it is preferable that the distance between the semiconductor chip 4 or the like generating the heat and the heat discharge plate 2 that actually dissipates the heat is shortened, and the thermal resistance over this distance be reduced as much as possible. For this reason, as is shown in FIG. 5B, instead of providing the stress cushioning layer 6, fixing the insulated circuit board 3 directly to the heat discharge plate 2 may be considered.

However, if the insulated circuit board 3 is fixed directly to the heat discharge plate 2, then as a result of the temperature of the insulated circuit board 3 repeatedly changing from a high temperature to a low temperature and vice versa by the heat generation and non-heat generation of the semiconductor chip 4 or the like, the drawback occurs that, as a result of stress being repeatedly applied to the first Al plate 3b forming the insulated circuit board 3, the portion to which the stress is applied becomes work-hardened. Moreover, if the first Al plate 3b becomes work-hardened, then it becomes difficult for the stress to be absorbed, and the problems arise of peeling occurring in the bond portion and the heat cycle longevity of the power module 1 being shortened.

Furthermore, if the heat discharge plate 2 is fixed to the insulated circuit board 3 by brazing, it is generally necessary for the brazing to be performed at a comparatively high temperature, and the drawback occurs that when the completed brazing is cooled, marked warping is generated in the power module 1 at room temperature due to disparities in the thermal coefficient of contraction.

SUMMARY OF THE INVENTION

It is an object of the present invention to provide a power module and power module with an attached heat sink in which an insulated circuit board is brazed directly to a heat discharge plate without any marked warping being generated so as to thereby improve the heat discharge characteristics thereof.

It is a further aim of the present invention to provide a power module and power module with an attached heat sink in which, even when the insulated circuit board is brazed directly to the heat discharge plate in this way, there is no work-hardening caused by stress arising from the heat cycle and there are no harmful effects on the heat cycle longevity.

As is shown in FIG. 1, the present invention is an improved power module in which one or two or more square insulated circuit boards 12 are fixed to one main surface of a heat discharge plate 11.

In the characteristic structure of the present invention, the heat discharge plate 11 is formed of an Al based alloy plate having a thickness of 3 to 10 mm, and the insulated circuit board 12 having a side B of 30 mm or less in length is brazed directly onto the heat discharge plate 11. Namely, by limiting the length of the one side B of the insulated circuit board 12 to 30 mm or less, it is possible to restrict to a comparatively small level disparities in the shrinkage at the edge of the insulated circuit board 12 that are based on disparities in the thermal coefficient of contraction of the heat discharge plate 11 and the insulated circuit board 12. Moreover, by using a comparatively thick 3 to 10 mm heat discharge plate 11, it is possible to inhibit any marked warping in the power module 10 that is generated when the insulated circuit board 12 is brazed directly onto the heat discharge plate 11. Furthermore, by brazing the insulated circuit board 12 directly onto the heat discharge plate 11, it is possible to make the distance between the insulated circuit board 12 and the heat discharge plate 11 shorter than is the case in a conventional power module that has a thermal stress cushioning layer, and thereby heightening the heat dissipation effect. Note that, in the present invention, the length of one side of the insulated circuit board 12 describes the length of one side of the external shape of the insulated circuit board 12.

Moreover, in the power module having the above described structure, it is preferable that the brazing material used to braze the insulated circuit board 12 to the heat discharge plate 11 is one or two or more brazing materials selected from Al—Si, Al—Ge, Al—Cu, Al—Mg, and Al—Mn based brazing materials. Because these brazing materials have a high degree of affinity with the materials of the bond portion of the insulated circuit board 12 and heat discharge plate 11, and because the second component, such as Si or Ge, that is contained in these brazing materials is dispersed to the insulated circuit board 12 and heat discharge plate 11, it is possible to obtain the effect of increasing the bond strength.

Next, it is preferable that the insulated circuit board 12 is provided with a ceramic substrate 12a formed of $Si_3N_4$, AlN, or $Al_2O_3$ and with first and second Al plates 12b, 12c that are bonded to both surfaces of the ceramic substrate 12a, and that the first or second Al plate 12b that is brazed to the heat discharge plate 11 has a purity of 99.98 or greater percent by weight.

It is comparatively difficult for an Al plate 12b having a purity of 99.98 or greater percent by weight to become work-hardened. In the power module of the present invention in which this type of Al plate 12b is brazed directly to the heat discharge plate 11, even if the temperature of the insulated circuit board 12 repeatedly fluctuates between a high temperature and a low temperature, there is no reduction in the stress absorption capacity of the Al plate 12b, and to make the heat cycle longevity of the power module 10 comparatively longer.

Next, as is shown in FIG. 2, it is also possible for the power module of the present invention to employ a structure in which the insulated circuit board 32 is provided with a ceramic substrate 32a formed of $Si_3N_4$, AlN, or $Al_2O_3$ and with an Al plate 32c that is bonded to one surface of the ceramic substrate 32a, and another surface of the ceramic substrate is brazed directly onto the heat discharge plate 11.

In the power module 30 having this structure, because the other surface of the ceramic substrate 32a is brazed directly onto the heat discharge plate 11, it is possible to reduce the thermal resistance even further compared with an insulated circuit board in which an Al plate is fixed to this other surface as well. Furthermore, because there is no Al plate fixed to the other surface of the ceramic substrate 32a, peeling that would have been caused by work-hardening of that Al Plate can be prevented, and it is possible to maintain an even longer heat cycle longevity for the power module 30. On the other hand, because a comparatively thick 3 to 10 mm (which is a thickness that makes it comparatively difficult for warping to occur) heat discharge plate 11 is used, and because one side B of the insulated circuit board 32 is restricted to 30 mm or less, it is possible to prevent any marked warping being generated in the power module 30 without providing an Al plate on the other surface of the ceramic substrate 32a.

Next, as is shown in FIG. 1, the present invention provides a power module in which another main surface of the heat discharge plate 11 of the previously described power module 10 is joined to a water cooled or air cooled heat sink 14 formed of an Al based alloy. The power module 10 of the present invention that is described above rapidly conducts heat generated by the semiconductor chip 16 or the like mounted thereon to the heat discharge plate 11. In the present structure in which the power module 10 is joined to the heat sink 14, this heat can be rapidly dissipated by the heat sink 14.

Next, as is shown in FIG. 3, in the power module with an attached heat sink of the present invention, the heat sink 24 is provided with a heat sink main body 25 in which is formed a coolant passage 25a and with a lid body 26 that is joined to the heat sink main body 25 so as to cover and seal the coolant passage 25a, and the heat discharge plate 11 of the power module described above is structured so as to be able to also function as the lid body 26.

In the power module with an attached heat sink of the present invention, as a result of the heat discharge plate doubling as the lid body 26, it is possible for the distance from the cooling medium that actually dissipates the heat to the semiconductor chip 16 or the like that is generating the heat to be shortened even further, and heat generated by the semiconductor chip 16 or the like can be effectively dissipated from the heat sink 24.

Next, as is shown in FIG. 1, the present invention provides a power module in which one or two or more square insulated circuit boards 12 are fixed to one main surface of a heat discharge plate 11, wherein the insulated circuit board 12 is provided with a ceramic substrate 12a formed of $Si_3N_4$, AlN, or $Al_2O_3$ and with first and second Al plates 12b, 12c that are bonded to both surfaces of the ceramic substrate 12a, and wherein the first Al plate 12b of the insulated circuit board 12 is brazed using one or two or more brazing materials selected from Al—Si, Al—Ge, Al—Cu, Al—Mg, and Al—Mn based brazing materials directly to the heat discharge plate 11 formed by an Al based alloy plate, and wherein the average values of atomic component contents measured by performing 5 point quantitative analysis using an EPMA in an area within the first Al plate 12b at a position 0.2 mm away from the heat discharge plate 11 on the first Al plate 12b side are within the following ranges: 0.05 percent by weight$\leq$Si$\leq$3.0 percent by weight when the brazing material is Al—Si based; 0.05 percent by weight$\leq$Cu$\leq$2.0 percent by weight when the brazing material is Al—Cu based; 0.05 percent by weight$\leq$Mg$\leq$2.0 percent by weight when the brazing material is Al—Mg based; 0.05 percent by weight$\leq$Mn$\leq$1.0 percent by weight when the brazing material is Al—Mn based; and 0.05 percent by weight$\leq$Ge$\leq$3.0 percent by weight when the brazing material is Al—Ge based.

As is shown in FIG. 1, the power module of the present invention is formed by brazing the insulated circuit board 12 directly to the heat discharge plate 11, and the brazing material used is one or two or more brazing materials selected from Al—Si, Al—Ge, Al—Cu, Al—Mg, and Al—Mn based brazing materials. In the power module of the present invention in which the insulated circuit board 12 is brazed directly to the heat discharge plate 11 in this manner, the elements contained in the brazing material serving as the bonding material are dispersed from the bond portion between the insulated circuit board 12 and the heat discharge plate 11 to other portions within these, and a dispersion layer is formed in the bond portion between the Al plate 12b of the insulated circuit board 12 and the heat discharge plate 11.

As a result of the formation of this dispersion layer, it is possible to obtain a sufficient bond strength, and it is also possible to achieve an improvement in the reliability of the power module, however, hardening of the constituent materials is generated simultaneously in this dispersion layer. If the extent of this hardening is too great, it is not possible for the stress caused by discrepancies in the shrinkage amounts of the heat discharge plate 11 and the insulated circuit board 12 when the power module is repeatedly heated and cooled (heat cycle) to be completely absorbed, and in some cases, this causes peeling at the bond portion. Conversely, if the degree of diffusion of the brazing material to the insulated circuit board 12 and heat discharge plate 11 is insufficient, then because the bond strength itself between the insulated circuit board 12 and the heat discharge plate 11 is decreased, peeling of the insulated circuit board 12 can easily occur. Accordingly, in the present invention, a power module having a lengthy heat cycle longevity is achieved in which, by regulating the extent of the diffusion of the brazing material components, peeling that is caused by the shrinkage that is accompanied by the heating and cooling is prevented while the bond strength is increased.

In the present invention, the extent of the above diffusion was measured by 5 point quantitative analysis (described in detail below) using an EPMA (electron probe micro analyzer) in an area within the Al plate 12b of the insulated circuit board 12 at a position not more than 0.2 mm away from the heat discharge plate 11. The present inventors then discovered that if the average values of the component content of the brazing material component detected at these measurement points were within the following component content ranges, then a sufficient bond strength was obtained and it was possible to effectively prevent the bonded surfaces of the insulated circuit board 12 and the heat discharge plate 11 from peeling away from each other due to stress arising from the expansion and contraction that accompanies the heating cycle, and thereby conceived the present invention. Namely, in the power module of the present invention the component contents of the Si, Cu, Mg, Mn, and Ge measured at the above measurement points were: 0.05 percent by weight≦Si≦3.0 percent by weight when the brazing material was Al—Si based; 0.05 percent by weight≦Cu≦2.0 percent by weight when the brazing material was Al—Cu based; 0.05 percent by weight≦Mg≦2.0 percent by weight when the brazing material was Al—Mg based; 0.05 percent by weight≦Mn≦1.0 percent by weight when the brazing material was Al—Mn based; and 0.05 percent by weight≦Ge≦3.0 percent by weight when the brazing material was Al—Ge based. The component content given for each of these components is an average value of the values measured at the measurement points using an EPMA, and no distinction was made as to whether the brazing material component had been diffused or whether the component has been in the Al plate 12b of the insulated circuit board 12 prior to the brazing. Namely, the ranges of the above component contents prescribe the ranges of the sums of the components contained in the Al plate 12b prior to the brazing and the component from the diffused brazing material. The present inventors verified in the examples given below that the ranges for the component content of each of these brazing material components were appropriate, and the specific methods used and results thereof are described in the examples in detail.

A description will now be given while referring to FIG. 4 of the 5 point quantitative analysis using an EPMA in the present invention. As is shown in FIG. 4, in the 5 point quantitative analysis using an EPMA of the present invention, an optional 5 points (P1 to P5) that are within the Al plate 12b that is bonded via brazing material (not shown) to the heat discharge plate 11 and that are also within an area of the Al plate 12b that is 0.2 mm away from the main surface of the heat discharge plate 11 are measured, and the average value of each of the component contents of Si, Cu, Mg, Mn, and Ge measured using an EPMA at the measurement points P1 to P5 is derived. Using this method it can be easily confirmed that the above component contents within the Al plate 12b are appropriate. The bonded surface of the heat discharge plate 11 with the Al plate 12b in FIG. 4 only indicates the surface 111A of the main surface 111 of the heat discharge plate 11 to which the insulated circuit board 12 is bonded, however, if this bonded surface is obscured, then when specifying a surface parallel with the surface 111A and 0.2 mm away therefrom, the surface 111B outside the surface 111A from the main surface 111 may also be used as a reference. Moreover, the measurement points P1 to P5 can be selected as an optional 5 points within the surface 0.2 mm away from the bonded surface, however, in order to obtain even more accurate information on the diffusion layer, it is preferable that there is at least a 0.5 mm gap between adjacent measurement points.

In the above described structure, it is preferable that the heat discharge plate 11 is an Al based alloy plate having a thickness A of 3 to 10 mm, and the insulated circuit boards 12, 32 have a side B with a length of 30 mm or less, and are brazed directly onto the heat discharge plate 11. If this type of structure is employed, then by limiting the length of the side B of the insulated circuit board 12 to 30 mm or less, it is possible to restrict to a comparatively small level disparities in the shrinkage at the edge of the insulated circuit board 12 that are based on disparities in the thermal coefficient of contraction of the heat discharge plate 11 and the insulated circuit board 12. Moreover, by using a comparatively thick 3 to 10 mm heat discharge plate 11, it is possible to inhibit any marked warping in the power module 10 that is generated when the insulated circuit board 12 is brazed directly onto the heat discharge plate 11. Accordingly, peeling caused by the shrinking that accompanies heating and cooling can be effectively prevented, and the heat cycle longevity can be extended.

Next, the present invention provides a power module in which one or two or more square insulated circuit boards (12) are fixed to one main surface of a heat discharge plate (11), wherein the insulated circuit board (12) is provided with a ceramic substrate (12a) formed of $Si_3N_4$, AlN, or $Al_2O_3$ and with first and second Al plates (12b, 12c) that are bonded to both surfaces of the ceramic substrate (12a), the first Al plate (12b) of the insulated circuit board (12) is brazed using one or two or more brazing materials selected from Al—Si, Al—Ge, Al—Cu, Al—Mg, and Al—Mn based brazing materials directly to the heat discharge plate (11) formed by an Al based alloy plate, and a layer formed by the brazing material is not visible at a portion where the heat discharge plate (11) is bonded to the first Al plate (12b) even when a scanning electron microscope image of a magnification of 1000 times or more is used.

Namely, in the power module of the present structure, components other than Al that are contained in the brazing material used in the bonding of the heat discharge plate 11 and the first Al plate 12b shown in FIG. 1 are diffused to the heat discharge plate 11 and/or the first Al plate 12b. As a result, these components disappear almost totally from the bond portion to the extent that no layer formed by the brazing material is visible even when a scanning electron microscope image of a magnification of 1000 times or more is used. Because no layer formed by the brazing material is visible, it can be considered that in the present structure the heat discharge plate 11 is substantially totally integrated with the first Al plate 12b, suggesting that an even stronger bond is formed between the two.

BEST MODE FOR CARRYING OUT THE INVENTION

Next, the first embodiment of the present invention will be described.

Figure 1:
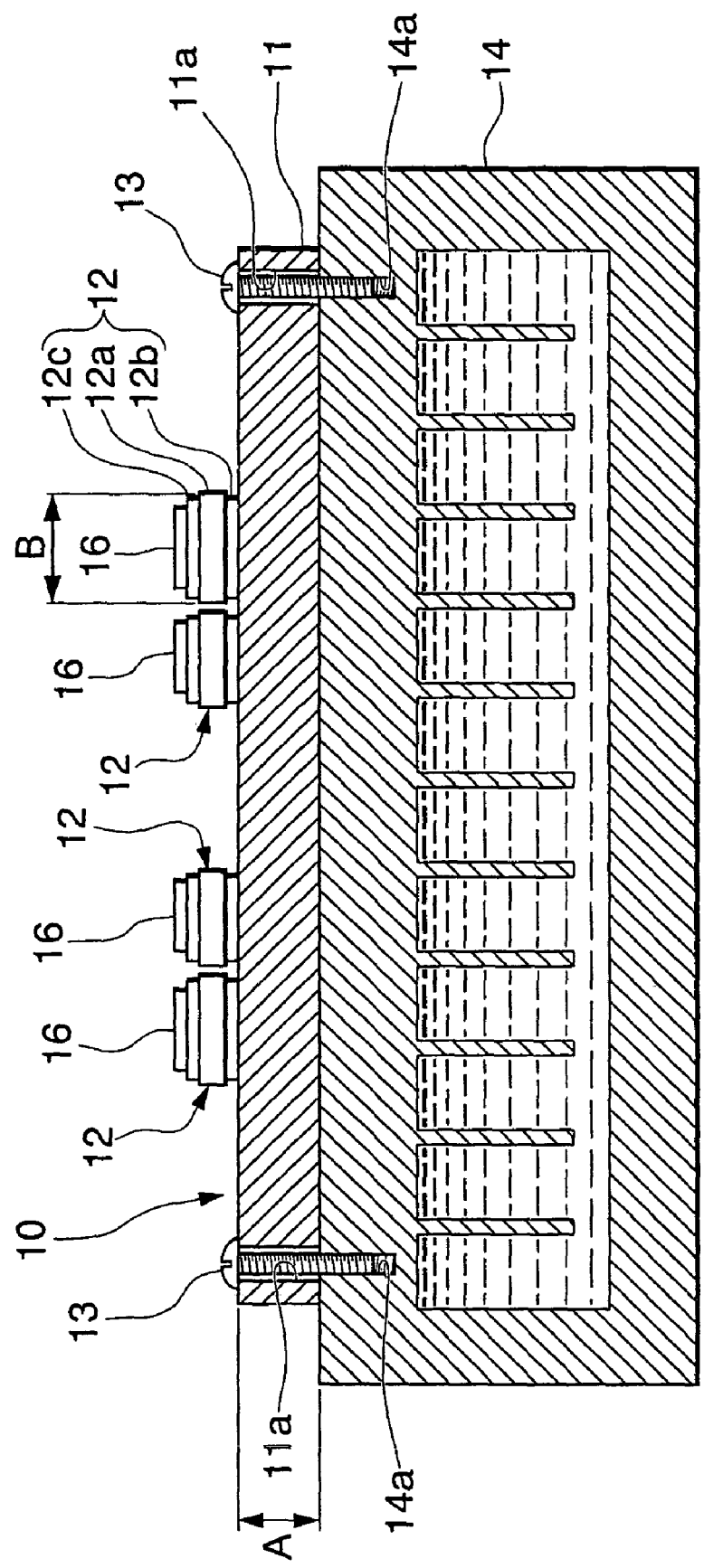
FIG. 1 is a vertical cross sectional view showing the structure of the power module according to the first embodiment of the present invention.

As is shown in FIG. 1, in the power module 10 of the present invention one or two or more square insulated circuit boards 12 are fixed to one main surface of a heat discharge plate 11. The heat discharge plate 11 is made of an Al based alloy material, and has a thickness A of approximately 3 to 10 mm. Each insulated circuit board 12 is provided with a ceramic substrate 12a formed of $Si_3N_4$, Al, or $Al_2O_3$ and having a thickness of 0.3 to 1.5 mm, and first and second Al plates 12b and 12c that are bonded to both surfaces of the ceramic substrate 12a. The first and second Al plates 12b and 2c preferably have a purity of 99.98 or more percent by weight, and a thickness of 0.25 to 0.6 mm. When the ceramic substrate 12a and the first and second Al plates 12b and 12c are stacked in a square configuration to form the insulated circuit board 12, the length of one side B is 30 mm or less.

The stacked bonding of the two sides of the ceramic substrate 12a with the first and second Al plates 12b and 12c is performed via a brazing material. Specifically, this is performed by the following process. Namely, in a state in which an Al—Si based brazing material (not shown), the ceramic substrate 12a, an Al—Si based brazing material (not shown), and the second Al plate 12c are stacked in the above order on top of the first Al plate 12b, a load of 50 to 500 kPa is applied to this stack, and the stack is heated in a vacuum to between 580° C. and 650° C. By bonding the stack in this manner, an insulated circuit board 12 having a side B of 30 mm or less is obtained. The second Al plate 12c on the topmost surface thereof is then formed by etching into a circuit having a predetermined pattern. Note that the Al—Si brazing material used is an alloy composed of 95 to 80 percent by weight of Al and 5 to 20 percent by weight of Si, and having a melting point of 575° C.

The insulated circuit board 12 having a side B of 30 mm or less is brazed directly to the heat discharge plate 11 using a brazing material, and it is preferable that one or two or more selected from Al—Si, Al—Cu, Al—Mg, Al—Mn, and Al—Ge based brazing materials be used for the brazing material. The brazing of the insulated circuit board 12 to the heat discharge plate 11 is performed by the following process. Namely, in a state in which this brazing material (not shown) and then the insulated circuit board 12 are stacked in this order on top of the heat discharge plate 11, a load of 50 to 500 kPa is applied to this stack, and the stack is heated in a vacuum to between 580° C. and 650° C. so as to melt the brazing. Thereafter, the stack is cooled so as to solidify the brazing. In this case, a brazing material having a melting point of approximately 575° C. is used, and the heat discharge plate 11 is bonded with the first Al plate 12b forming the insulated circuit board 12 without melting the brazing material bonding together the stacked ceramic substrate 12a with the first and second Al plates 12b and 12c. In the power module 10 that is structured in this manner, a male threaded bolt 13 may be inserted a mounting hole 11a formed in a corner of the heat discharge plate 11 and screwed into a female threaded hole 14a formed in a water cooled type of heat sink 14. As a result, the water cooled heat sink 14, which is formed of Al alloy, is joined to the other main surface of the heat discharge plate 11.

Moreover, in the power module of the present embodiment, the components contained in the brazing material are diffused to the insulated circuit board 12 and the heat discharge plate 11 by the bonding of the insulated circuit board 12 with the heat discharge plate 11, and, by adjusting the load conditions and heat conditions, the extent of this diffusion can be adjusted to obtain the optimum diffusion extent. By performing measurement such as that described below, this can be easily confirmed. Namely, if the average values of the content measured by 5 point quantitative analysis using an EPMA at a position 0.2 mm from the heat discharge plate 11 in an area within the Al plate 12b of the insulated circuit board 12 are within the following ranges: 0.05 percent by weight$\leq$Si$\leq$3.0 percent by weight when the brazing material is Al—Si based; 0.05 percent by weight$\leq$Cu$\leq$2.0 percent by weight when the brazing material is Al—Cu based; 0.05 percent by weight$\leq$Mg$\leq$2.0 percent by weight when the brazing material is Al—Mg based; 0.05 percent by weight$\leq$Mn$\leq$1.0 percent by weight when the brazing material is Al—Mn based; and 0.05 percent by weight$\leq$Ge$\leq$3.0 percent by weight when the brazing material is Al—Ge based, then the two can be appropriately bonded.

In the power module 10 that is formed in this manner, because the insulated circuit board 12 on which the semiconductor chip 16 or the like is actually mounted is brazed directly onto the heat discharge plate 11, the distance between the two makes it possible for the heat generated by the semiconductor chip 16 or the like to be immediately transmitted to the heat discharge plate 11, and to be rapidly dissipated from the water cooled heat sink 14.

The fastening of the heat discharge plate 11 to the insulated circuit board 12 is achieved by brazing. In the power module 10 of the present invention, because a comparatively thick 3 to 10 mm (which is a thickness that makes it comparatively difficult for warping to occur) heat discharge plate 11 is used, and because the one side B of the insulated circuit board 12 is restricted to 30 mm or less, it is possible to keep to a comparatively small level disparities in the shrinkage at the edge of the insulated circuit board 12 that are based on disparities in the thermal coefficient of contraction of the heat discharge plate 11 and insulated circuit board 12 occurring during the brazing. As a result, it is possible to keep to a comparatively small level disparities in the shrinkage at the edge of the insulated circuit board 12 that arise during the heat cycle without marked warping in the power module 10 being generated, and it is also possible to keep the longevity of the heat cycle comparatively long.

Furthermore, in the power module 1 of the present embodiment, because the Al plate 12b that forms the insulated circuit board 12 and that is actually brazed to the heat discharge plate 11 has a purity of not less than 99.98 percent by weight, which makes it resistant to work-hardening, even if the temperature of the insulated circuit board 12 repeatedly fluctuates between a high temperature and a low temperature due to the heat generation and non-heat generation of the semiconductor chip 16 or the like, there is no work-hardening of the Al plate 12b caused by the repeated action thereon of thermal stress. Accordingly, it is possible to inhibit any reduction in the capacity to absorb stress caused by this temperature cycle, to inhibit any reduction in the capacity to absorb stress caused by the heat cycle of the power module 10, and to maintain an even greater heat cycle longevity for the power module 10.

Note that, in the above described embodiment, the brazing process performed in order to bond the first and second Al plates 12b and 12c to the two surfaces of the ceramic substrate 12a carried out separately from the brazing process performed in order to bond the insulated circuit board 12 that is created by the above bonding process to the heat discharge plate 11, however, it is also possible for these to be performed simultaneously in a single brazing process.

Next, the second embodiment of the present invention will be described. The same symbols in the drawings as those appearing in the above first embodiment are given the same descriptive symbols and a repeated description there of is omitted.

Figure 2:
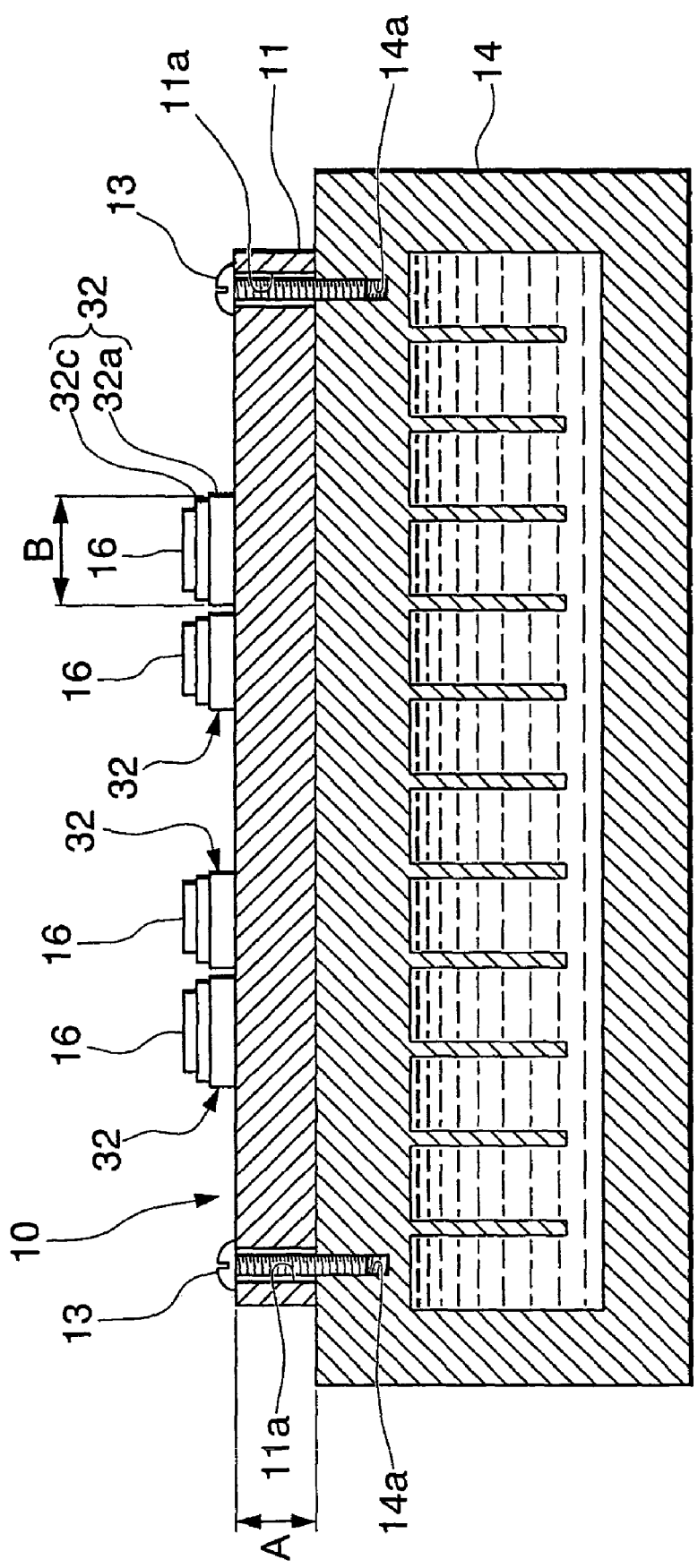
FIG. 2 is a vertical cross sectional view showing the structure of the power module according to the second embodiment of the present invention.

As is shown in FIG. 2, in the power module 30 of the present invention one or two or more square insulated circuit boards 32 are fixed to one main surface of the heat discharge plate 11. The heat discharge plate 11 is formed of an Al based alloy having a thickness A of 3 to 10 mm. Each insulated circuit board 32 is provided with a ceramic substrate 32a formed of $Si_3N_4$, Al, or $Al_2O_3$ and having a thickness of 0.3 to 1.5 mm, and an Al plates 32c that is bonded to one surface of the ceramic substrate 32a. When the ceramic substrate 32a and the Al plate 32c are stacked in a square configuration to form the insulated circuit board 32, the length of one side B is 30 mm or less. The Al plate 32b is stacked on one surface of the ceramic plate 32a and fixed thereto by the same procedure as described for the first embodiment. Thereafter, the Al plate 32c is formed by etching into a circuit having a predetermined pattern.

The insulated circuit board 32 having a side B of 30 mm or less that is obtained in this way is brazed directly to the heat discharge plate 11 using an Al—Si, Al—Cu, Al—Mg, Al—Mn, or Al—Ge based brazing material. The brazing of the insulated circuit board 32 to the heat discharge plate 11 is performed by placing the above brazing material (not shown) on top of the heat discharge plate 11, and stacking the insulated circuit board 32 on top of this such that the other surface of the ceramic substrate 32a faces the heat discharge plate 11. In this state, a load of 50 to 500 kPa is applied to this stack, and the stack is heated in a vacuum to between 580° C. and 650° C. so as to melt the brazing. Thereafter, the stack is cooled so as to solidify the brazing. In this case, a brazing material having a melting point of approximately 575° C. is used, and the heat discharge plate 11 is bonded with the ceramic substrate 32a forming the insulated circuit board 32 without melting the ceramic substrate 32a and the ceramic substrate 32a forming the Al plate 32b. The components contained in the brazing material are diffused to the insulated circuit board 32 and/or the heat discharge plate 11 by this bonding, and a diffusion layer where the brazing material components have been diffused is formed on the bonded portion. By adjusting the load conditions and heat conditions, the extent of this diffusion of the brazing material components can be adjusted to obtain the optimum diffusion extent. In the power module 30 that is structured in this manner, a male threaded bolt. 13 may be inserted a mounting hole 11a formed in a corner of the heat discharge plate 11 and screwed into a female threaded hole 14a formed in a water cooled type of heat sink 14. As a result, the water cooled heat sink 14, which is formed of an Al based alloy, is joined to the other main surface of the heat discharge plate 11.

In the power module 30 that is formed in this manner, because the other surface of the ceramic substrate 32a forming the insulated circuit board 32 on which the semiconductor chip 16 or the like is mounted is brazed directly onto the heat discharge plate 11, the distance between the two can be shortened even more than in the first embodiment, in which the Al plate is also fixed onto the other surface of the ceramic plate 32a, so that the thermal resistance can be reduced even further, and the heat generated by the semiconductor chip 16 or the like mounted thereon can be immediately transmitted to the heat discharge plate 11.

Because an Al plate is fixed onto the other surface of the ceramic plate 32a, it is possible to prevent peeling caused by this Al plate becoming work-hardened, and it is possible for the heat cycle longevity of the power module 30 to be held at an even longer lifespan. On the other hand, in the power module 30 of the present invention, because a comparatively thick 3 to 10 mm (which is a thickness that makes it comparatively difficult for warping to occur) heat discharge plate 11 is used, and because the one side B of the insulated circuit board 32 is restricted to 30 mm or less, it is possible to keep to a comparatively small level disparities in the shrinkage at the edge of the insulated circuit board 32 that are based on disparities in the thermal coefficient of contraction of the heat discharge plate 11 and insulated circuit board 32 occurring during the heat cycle. As a result, there is no marked warping in the power module 30.

Figure 3:
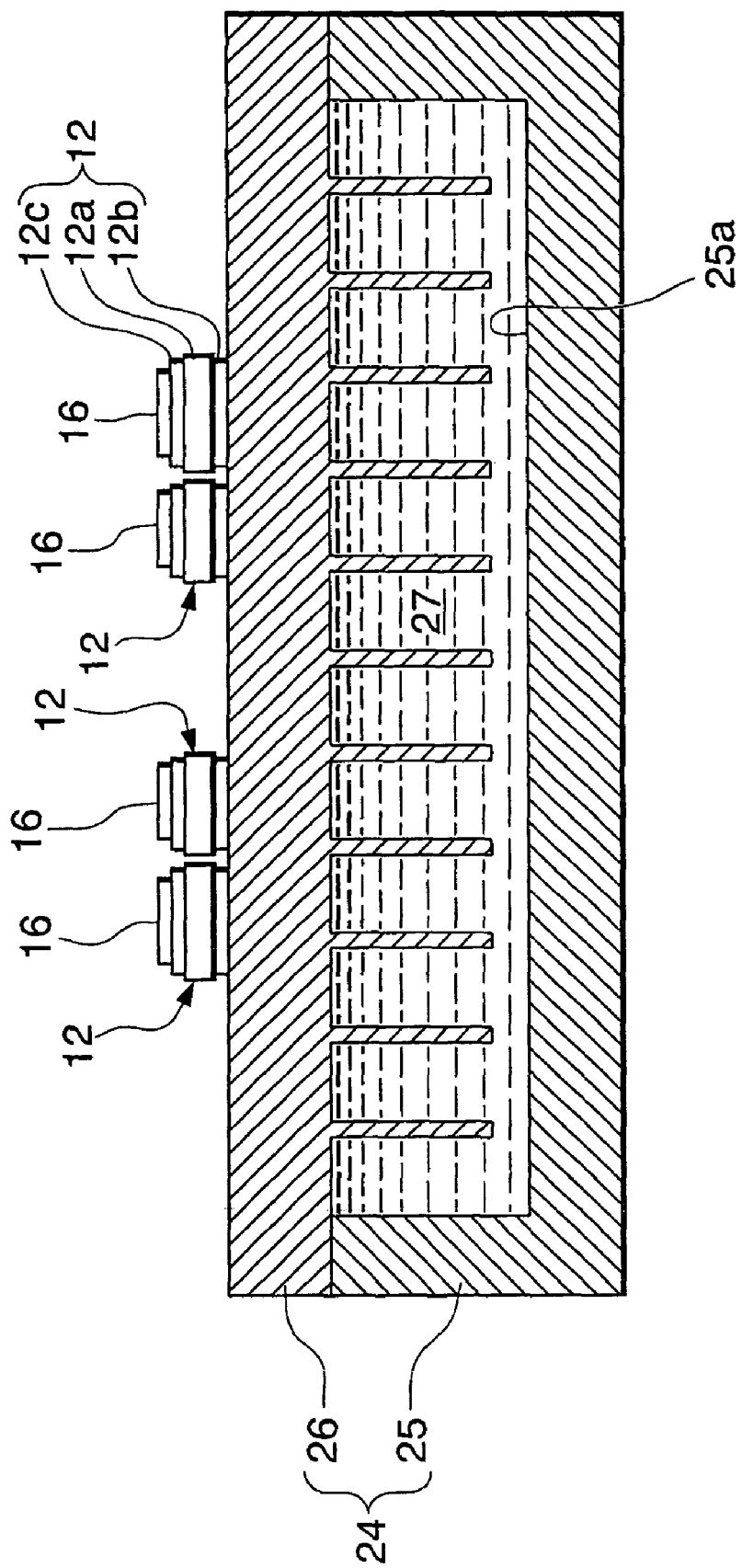
FIG. 3 is a vertical cross sectional view showing the structure of another power module of the present invention in which the heat discharge plate doubles as a lid body for a heat sink.
Figure 4:
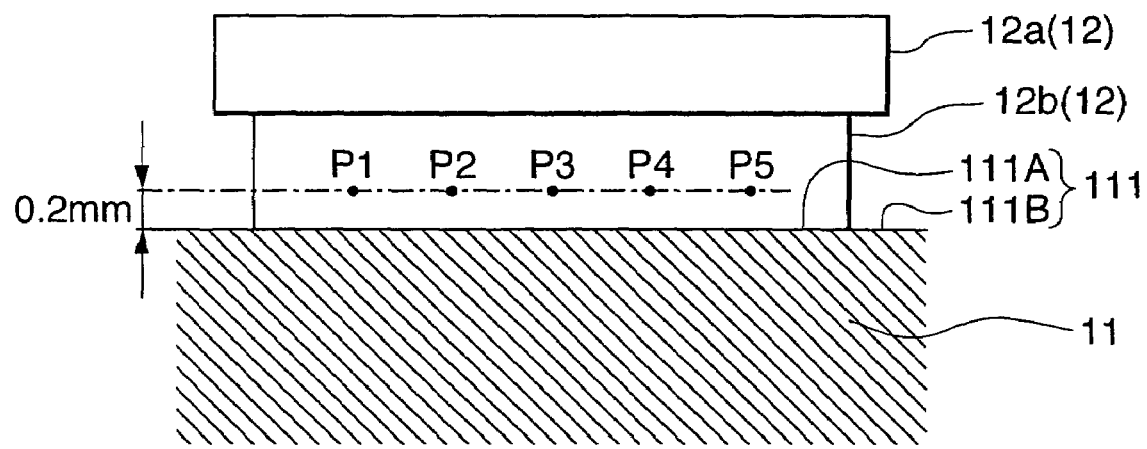
FIG. 4 is a structural view showing measurement points when 5 point quantitative analysis is performed using an EPMA of the power module according to the present invention.
Figure 5A:
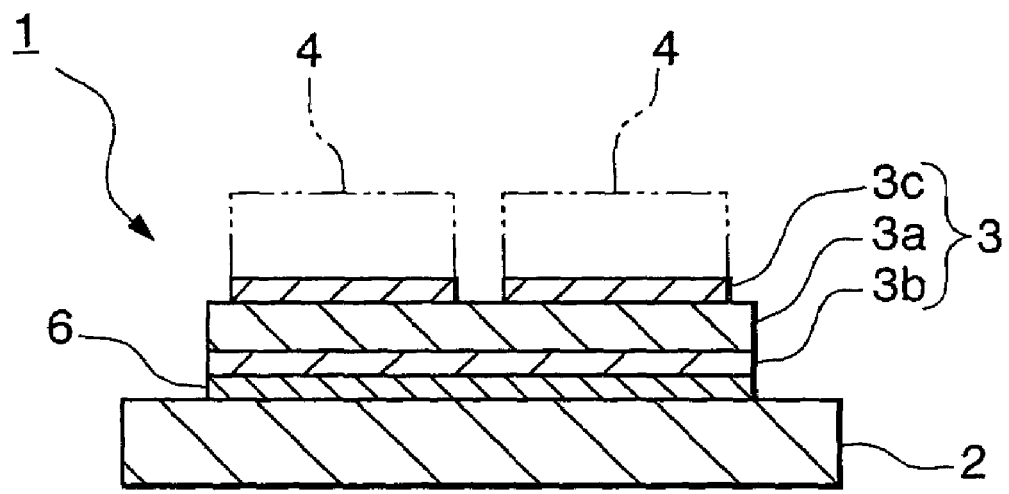
FIG. 5A is a vertical cross sectional view showing the structure of a conventional power module.
Figure 5B:
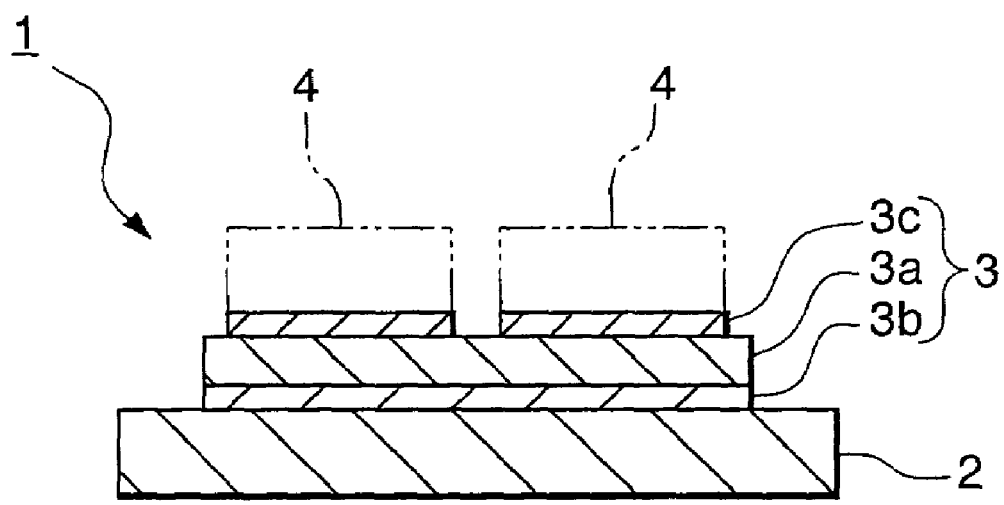
FIG. 5B is a vertical cross sectional view showing the structure of a conventional power module.

Note that, in the above described first and second embodiments, a heat sink type of power module 10 is described in which the other main surface of the heat discharge plate 11 of the power module 10 is joined to a water cooled type of heat sink 14, however, the heat sink may also be an air cooled type. Here, as is shown in FIG. 3, if the heat sink 24 is one provided with a heat sink main body 25 in which is formed a coolant passage 25a and with a lid body 26 that is joined to the heat sink main body 25 so as to cover and seal the coolant passage 25a, then it is also possible for the heat discharge plate to double as the lid body 26. The lid body 26 shown in the drawing is brazed to the heat sink main body 25, and if the heat discharge plate doubles in this way as the lid body 26, then it becomes possible to shorten the distance even more between water 27, which is the coolant that actually dissipates the heat, and the semiconductor chip 16 or the like that is generating the heat. As a result, heat generated by the semiconductor chip 16 or the like can be even more rapidly dissipated from the heat sink 24.

EXAMPLES

Examples and comparative examples of the present invention will now be described in detail.

Example 1

As is shown in FIG. 1, an insulated circuit board 12 was formed by stacking Al plates 12b and 12c that have vertical, horizontal, and thickness dimensions respectively of 15 mm, 15 mm, and 0.4 mm on both sides of a ceramic substrate 12a that has the same vertical and horizontal dimensions as the Al plates 12b and 12c and has a thickness dimension of 0.635 mm. This insulated circuit board 12 was prepared together with a heat discharge plate 11 formed by an Al based alloy plate having vertical, horizontal, and thickness dimensions respectively of 100 mm, 100 mm, and 3 mm. The insulated circuit board 12 that is used here has first and second Al plates 12b and 12c having a purity of 99.98 or more percent by weight bonded to both surfaces of a ceramic substrate 12a formed $Si_3N_4$.

The insulated circuit board 12 and heat discharge plate 11 were placed in a stack and then a load of 150 kPa was applied thereto and the stack was heated in a vacuum to 620° C. The stack was left in this state for 20 minutes and was then cooled, resulting in the insulated circuit board 12 being brazed directly to the heat discharge plate 11 using Al—Si brazing material. As a result, a power module 10 was obtained. The power module, obtained in this manner was used as a test sample for Example 1.

Example 2

An insulated circuit board 12 formed of the same materials as the power module of Example 1 by stacking Al plates 12b and 12c that have vertical, horizontal, and thickness dimensions respectively of 20 mm, 20 mm, and 0.4 mm on both sides of a ceramic substrate 12a that has the same vertical and horizontal dimensions as the Al plates 12b and 12c and has a thickness dimension of 0.635 mm was prepared together with a heat discharge plate 11 formed by an Al based alloy plate having vertical, horizontal, and thickness dimensions respectively of 100 mm, 100 mm, and 6 mm.

A power module 10 was obtained by brazing this insulated circuit board 12 directly to the heat discharge plate 11 using Al—Si brazing material under the same conditions as in Example 1. The power module obtained in this manner was used as a test sample for Example 2.

Example 3

An insulated circuit board 12 formed of the same materials as the power module of Example 1 by stacking Al plates 12b and 12c that have vertical, horizontal, and thickness dimensions respectively of 30 mm, 30 mm, and 0.4 mm on both sides of a ceramic substrate 12a that has the same vertical and horizontal dimensions as the Al plates 12b and 12c and has a thickness dimension of 0.635 mm was prepared together with a heat discharge plate 11 formed by an Al based alloy plate having vertical, horizontal, and thickness dimensions respectively of 100 mm, 100 mm, and 8 mm.

A power module 10 was obtained by brazing this insulated circuit board 12 directly to the heat discharge plate 11 using Al—Si brazing material under the same conditions as in Example 1. The power module obtained in this manner was used as a test sample for Example 3.

Comparative Example 1

An insulated circuit board 12 formed of the same materials as the power module of Example 1 by stacking Al plates 12b and 12c that have vertical, horizontal, and thickness dimensions respectively of 30 mm, 30 mm, and 0.4 mm on both sides of a ceramic substrate 12a that has the same vertical and horizontal dimensions as the Al plates 12b and 12c and has a thickness dimension of 0.635 mm was prepared together with a heat discharge plate 11 formed by an Al based alloy plate having vertical, horizontal, and thickness dimensions respectively of 100 mm, 100 mm, and 15 mm.

A power module 10 was obtained by brazing this insulated circuit board 12 directly to the heat discharge plate 11 using Al—Si brazing material under the same conditions as in Example 1. The power module obtained in this manner was used as a test sample for Comparative Example 1.

Comparative Example 2

An insulated circuit board 12 formed of the same materials as the power module of Example 1 by stacking Al plates 12b and 12c that have vertical, horizontal, and thickness dimensions respectively of 50 mm, 50 mm, and 0.4 mm on both sides of a ceramic substrate 12a that has the same vertical and horizontal dimensions as the Al plates 12b and 12c and has a thickness dimension of 0.635 mm was prepared together with a heat discharge plate 11 formed by an Al based alloy plate having vertical, horizontal, and thickness dimensions respectively of 100 mm, 100 mm, and 5 mm.

A power module 10 was obtained by brazing this insulated circuit board 12 directly to the heat discharge plate 11 under the same conditions as in Example 1. The power module obtained in this manner was used as a test sample for Comparative Example 2.

Comparative Example 3

An insulated circuit board 12 formed of the same materials as the power module of Example 1 by stacking Al plates 12b and 12c that have vertical, horizontal, and thickness dimensions respectively of 40 mm, 40 mm, and 0.4 mm on both sides of a ceramic substrate 12a that has the same vertical and horizontal dimensions as the Al plates 12b and 12c and has a thickness dimension of 0.635 mm was prepared together with a heat discharge plate 11 formed by an Al based alloy plate having vertical, horizontal, and thickness dimensions respectively of 100 mm, 100 mm, and 2 mm.

A power module 10 was obtained by brazing this insulated circuit board 12 directly to the heat discharge plate 11 under the same conditions as in Example 1. The power module obtained in this manner was used as a test sample for Comparative Example 3.

Note that the structure of the power modules of each of the above Examples 1 to 3 and Comparative Examples 1 to 3 is shown in FIG. 1.

Comparative Tests and Evaluations

The power modules of each of the above Examples 1 to 3 and Comparative Examples 1 to 3 were subjected in a thermal shock tester to a temperature cycle consisting of −40° C. for 30 minutes/room temperature for 30 minutes/125° C. for 30 minutes/room temperature for 30 minutes. This temperature cycle was repeated 100 times at which point an observation of whether or not there was any peeling of the insulated circuit board 12 away from the heat discharge plate 11 was carried out. If it was confirmed that there was no peeling, the temperature cycle was repeated for a further 100 times. This was repeated until peeling was confirmed and the number of times the temperature cycle was repeated until peeling was confirmed was measured as the temperature cycle longevity. Note that the existence or otherwise of peeling was confirmed using a magnifying glass. The results of these tests are shown in table 1.

TABLE 1

| | Size of insulated circuit board (mm) | Thickness of heat discharge plate (mm) | Temperature cycle longevity (number of times) |
|---|---|---|---|
| Example 1 | 15 × 15 × 0.635 | 3 | 4000 |
| Example 2 | 20 × 20 × 0.635 | 6 | 3500 |
| Example 3 | 30 × 30 × 0.635 | 8 | 3100 |
| Comparative Example 1 | 30 × 30 × 0.635 | 15 | 2000 |
| Comparative Example 2 | 50 × 50 × 0.635 | 5 | 1500 |
| Comparative Example 3 | 40 × 40 × 0.635 | 2 | 100 |

As is clear from Table 1, in Examples 1 to 3 in which the thickness of the heat discharge plate was between 3 and 10 mm and the one side B of the insulated circuit board was 30 mm or less in length, the figure for the temperature cycle longevity in each case was comparatively high at 3000 times or more. It may be considered that this is a result of disparities in the shrinkage at the edge of the insulated circuit board 12 generated during the heat cycle being kept to a comparatively small level due to the one side B of the insulated circuit board 12 being restricted to 30 mm or less.

In contrast, in the power modules of Comparative Examples 1–3 that are not restricted by the above condition, the 2000 times attained by the power module of Comparative Example 1 that has the smallest insulated circuit board is the greatest number, while only 100 times were attained by the power module of Comparative Example 3 that has the largest insulated circuit board. It may be considered that this is caused by the disparities in the shrinkage at the edge of the insulated circuit board 12 generated during the heat cycle being comparatively great due to the large size of the insulated circuit board 12. Furthermore, it may also be considered that, because the heat discharge plate has a greater thickness in the power module of Comparative Example 1 that uses the same insulated circuit board as the insulated circuit board of the power module of Example 3, disparities in the shrinkage at the edge of the insulated circuit board are mainly absorbed by the insulated circuit board, causing, as a result, the temperature cycle longevity to deteriorate.

Example 4

Next, an insulated circuit board 12 formed of the same materials as the power module of Example 1 by stacking Al plates 12b and 12c that have vertical, horizontal, and thickness dimensions respectively of 15 mm, 15 m, and 0.4 mm on both sides of a ceramic substrate 12a that has the same vertical and horizontal dimensions as the Al plates 12b and 12c and has a thickness dimension of 0.635 mm was prepared together with a heat discharge plate 11 formed by an Al based alloy plate having vertical, horizontal, and thickness dimensions respectively of 100 mm, 100 mm, and 3 mm.

This insulated circuit board 12 was stacked on the heat discharge plate 11 via an Al—Si based brazing material, a load was applied thereto, and the stack was heated in a vacuum so as to be bonded together. By appropriately adjusting the load conditions and heating conditions at this time, the extent of the diffusion to the insulated circuit board 12 and the heat discharge plate 11 of the Si contained in the brazing material was adjusted. By leaving this stack in this state for 20 minutes and then cooling it, a power module in which the insulated circuit board 12 was brazed directly onto the heat discharge plate 11 was obtained. The power module obtained in this manner was taken as test sample 4A. By performing the above described 5 point quantitative analysis on this power module using an EPMA, the amount of Si contained within an area of the Al plate 12b of the insulated circuit board 12 at a position 0.2 mm away from the heat discharge plate 11 was measured and found to be 0.05 percent by weight. The measurement apparatus and measurement conditions used in this EPMA measurement were as follows:

Apparatus: JXA-8800RL manufactured by Japan Electronics Co.
Acceleration Voltage: 15 kV
Irradiation current: $3 \times 10^{-8}$ A on a Faraday cut.
Beam-diameter: 5 µmφ
Standard test sample:

| | |
|---|---|
| Al (purity 99.99%) | |
| Si (purity 99.99%) | (when using Al—Si based brazing material) |
| Cu (purity 99.99%) | (when using Al—Cu based brazing material) |
| Mg (purity 99.99%) | (when using Al—Mg based brazing material) |
| Mn (purity 99.99%) | (when using Al—Mn based brazing material) |
| Ge (purity 99.99%) | (when using Al—Ge based brazing material) |

Next, an insulated circuit board 12 formed of the same materials as the power module of test sample 4A by stacking Al plates 12b and 12c that have vertical, horizontal, and thickness dimensions respectively of 15 mm, 15 mm, and 0.4 mm on both sides of a ceramic substrate 12a that has the same vertical and horizontal dimensions as the Al plates 12b and 12c and has a thickness dimension of 0.635 mm was prepared together with a heat discharge plate 11 formed by an Al based alloy plate having vertical, horizontal, and thickness dimensions respectively of 100 mm, 100 mm, and 3 mm.

This insulated circuit board 12 was stacked on the heat discharge plate 11 via an Al—Si based brazing material, a load was applied thereto, and the stack was heated in a vacuum so as to be bonded together. By changing the load conditions and heating conditions at this time, the extent of the diffusion to the insulated circuit board 12 and the heat discharge plate 11 of the Si contained in the brazing material was adjusted and the two were bonded together so as to create four types of power module. By leaving this stack in this state for 20 minutes and then cooling it, power modules in which the insulated circuit board 12 was brazed directly onto the heat discharge plate 11 were obtained. The power modules obtained in this manner were taken as test samples 4B to 4E. By performing the above described 5 point quantitative analysis on these power modules using an EPMA, the amount of Si contained within an area of the Al plate 12b of the insulated circuit board 12 at a position 0.2 mm away from the heat discharge plate 11 was measured and found to be 1.5 percent by weight in the case of the power module of test sample 4B, 3.0 percent by weight in the case of the power module of test sample 4C, 0.02 percent by weight in the case of the power module of test sample 4D, and 4.0, percent by weight in the case of the power module of test sample 4E.

Example 5

Next, power modules were prepared in the same manner as for the above Example 4 other than using an AL—Cu based brazing material for the brazing material. By changing the load conditions and heating conditions when bonding the insulated circuit board 12 to the heat discharge plate 11 to various settings, the extent of the diffusion to the insulated circuit board 12 and the heat discharge plate 11 of the Cu contained in the brazing material was changed so as to create five types of power module that were taken as test samples 5A to 5E. The amount of Cu was measured for each of these power modules in the same way as for Example 4 and found to be respectively 0.02 percent by weight, 0.05 percent by weight, 1.0 percent by weight, 2.0 percent by weight, and 3.0 percent by weight.

Example 6

Next, power modules were prepared each having the same structure as those of the above Example 4 other than an AL—Mg based brazing material being used for the brazing material. By changing the load conditions and heating conditions when bonding the insulated circuit board 12 to the heat discharge plate 11 to various settings, the extent of the diffusion to the insulated circuit board 12 and the heat discharge plate 11 of the Mg contained in the brazing material was changed so as to create five types of power module that were taken as test samples 6A to 6E. The amount of Mg was measured for each of these power modules in the same way as for Example 4 and found to be respectively 0.03 percent by weight, 0.05 percent by weight, 1.0 percent by weight, 2.0 percent by weight, and 3.0 percent by weight.

Example 7

Next, power modules were prepared each having the same structure as those of the above Example 4 other than an AL—Mn based brazing material being used for the brazing material. By changing the load conditions and heating conditions when bonding the insulated circuit board 12 to the heat discharge plate 11 to various settings, the extent of the diffusion to the insulated circuit board 12 and the heat discharge plate 11 of the Mn contained in the brazing material was changed so as to create five types of power module that were taken as test samples 7A to 7E. The amount of Mn was measured for each of these power modules in the same way as for Example 4 and found to be respectively 0.01 percent by weight, 0.05 percent by weight, 0.5 percent by weight, 1.0 percent by weight, and 2.0 percent by weight.

Example 8

Next, power modules were prepared each having the same structure as those of the above Example 4 other than an AL—Ge based brazing material being used for the brazing material. By changing the load conditions and heating conditions when bonding the insulated circuit board 12 to the heat discharge plate 11 to various settings, the extent of the diffusion to the insulated circuit board 12 and the heat discharge plate 11 of the Ge contained in the brazing material was changed so as to create five types of power module that were taken as test samples 8A to 8E. The amount of Ge was measured for each of these power modules in the same way as for Example 4 and found to be respectively 0.02 percent by weight, 0.05 percent by weight, 1.5 percent by weight, 3.0 percent by weight, and 4.0 percent by weight.

Evaluation

An evaluation of the thermal cycle longevity was performed in the same manner as for the above Examples 1 to 3 for the power modules of each test sample of the above Examples 4 to 8. The results thereof are shown in Table 2. As is shown in Table 2, it was confirmed that each of the power modules in which the content at the measurement points of the brazing material components is in the range of 0.05%≦Si≦3.0%, 0.05%≦Cu≦2.0%, 0.05%≦Mg≦2.0%, 0.05% Mn≦1.0%, and 0.05%≦Ge≦3.0% (all percentages by weight) has an excellent temperature longevity cycle. In contrast to this, those power modules in which the content at the measurement points of the brazing material components is outside the above range each have a shorter temperature cycle longevity than those power modules whose content is within the above range. Among these power modules, it may be considered that those power modules in which the content is too small are outside the range because the bond strength between the insulated circuit board 12 and the heat discharge plate 11 is insufficient, while those in which the content is too large are outside the range because the Al plater 12b of the insulated circuit board 12 hardens and stress caused by expansion and contraction of the heat discharge plate 11 in accompaniment with the temperature cycle cannot be completely absorbed.

TABLE 2

| Test sample No. | | Brazing material | Brazing material content found by EPMA 5 point quantitative analysis (% by weight) | Temperature cycle longevity (number of times) |
|---|---|---|---|---|
| Example 4 | 4D | Al—Si | 0.03 | 500 |
| | 4A | Al—Si | 0.05 | 3400 |
| | 4B | Al—Si | 1.5 | 5100 |
| | 4C | Al—Si | 3.0 | 4800 |
| | 4E | Al—Si | 4.0 | 1800 |
| Example 5 | 5A | Al—Cu | 0.02 | 200 |
| | 5B | Al—Cu | 0.05 | 3100 |
| | 5C | Al—Cu | 1.0 | 4700 |
| | 5D | Al—Cu | 2.0 | 3100 |
| | 5E | Al—Cu | 3.0 | 1200 |
| Example 6 | 6A | Al—Mg | 0.03 | 400 |
| | 6B | Al—Mg | 0.05 | 3300 |
| | 6C | Al—Mg | 1.0 | 3800 |
| | 6D | Al—Mg | 2.0 | 3000 |
| | 6E | Al—Mg | 3.0 | 2100 |
| Example 7 | 7A | Al—Mn | 0.01 | 100 |
| | 7B | Al—Mn | 0.05 | 3100 |
| | 7C | Al—Mn | 0.5 | 5000 |
| | 7D | Al—Mn | 1.0 | 3400 |
| | 7E | Al—Mn | 2.0 | 1700 |
| Example 8 | 8A | Al—Ge | 0.02 | 600 |
| | 8B | Al—Ge | 0.05 | 3700 |
| | 8C | Al—Ge | 1.5 | 4600 |
| | 8D | Al—Ge | 3.0 | 3200 |
| | 8E | Al—Ge | 4.0 | 1700 |

INDUSTRIAL APPLICABILITY

In the present invention, in a power module in which one or two or more square insulated circuit boards are fixed to one main surface of a heat discharge plate, a structure is employed in which the heat discharge plate is formed of an Al based alloy plate having a thickness of 3 to 10 mm, and the insulated circuit board having a side of 30 mm or less in length is brazed directly onto the heat discharge plate, and the components of the brazing material are dispersed to the insulated circuit board and/or the heat discharge plate. Namely, by limiting the length of one side of the insulated circuit board to 30 mm or less, it is possible to obtain the effect of restricting to a comparatively small level disparities in the shrinkage at the edge of the insulated circuit board that are based on disparities in the thermal coefficient of contraction of the heat discharge plate and the insulated circuit board. Moreover, by using a comparatively thick 3 to 10 mm heat discharge plate, the effect is obtained that it is possible to inhibit any marked warping in the power module that is generated when the insulated circuit board is brazed directly onto the heat discharge plate. Furthermore, by brazing the insulated circuit board directly onto the heat discharge plate it is possible to make the distance between the insulated circuit board and the heat discharge plate shorter than is the case conventionally, and thereby provide the effect of heightening the heat dissipation. As a result, it is possible to improve the heat discharge performance without generating any marked warping.

If one or two or more brazing materials selected from Al—Si, Al—Ge, Al—Cu, Al—Mg, and Al—Mn based brazing materials are used as the above described brazing material, then because these brazing materials have a high degree of affinity with the materials forming the insulated circuit board and heat discharge plate, the bonding is easily achieved and a sufficient bonding strength is easily obtained.

If a ceramic substrate on both sides of which Al plates have been bonded is used as the insulated circuit board, then if the purity of the Al plate of the insulated circuit board that is brazed onto the heat discharge plate is 99.98% or more by weight, any reduction in the capacity to absorb thermal stress in this Al plate caused by the temperature cycle can be inhibited, and a lengthy heat cycle longevity can be maintained for the power module. On the other hand, if this Al plate is omitted and the other surface of the ceramic substrate is brazed directly onto the heat discharge plate, then it is possible to reduce even further the thermal resistance without generating any marked warping in the power module, and it is possible to further lengthen the heat cycle longevity as any work-hardening of this Al plate is no longer a factor.

Furthermore, if this power module is joined to a heat sink, heat generated by a semiconductor chip or the like that is mounted on the insulated circuit board can be rapidly dissipated from the heat sink, and, if a structure is employed in which the heat discharge plate of the power module doubles as a lid body for the heat sink, then the distance from the cooling medium that actually dissipates the heat to the semiconductor chip or the like that is generating the heat can be shortened even further, and heat generated by the semiconductor chip or the like can be effectively dissipated from the heat sink.

Moreover, the power module of the present invention is provided with an insulated circuit board formed by a ceramic substrate made of $Si_3N_4$, AlN, or $Al_2O_3$ and a first and second Al plate that are bonded to both sides of the ceramic substrate, and the first Al plate of the insulated circuit board is brazed directly onto a heat discharge plate formed of an Al based alloy using one or two or more brazing materials selected from Al—Si, Al—Ge, Al—Cu, Al—Mg, and Al—Mn based brazing materials, and the average values of the component content measured by 5 point quantitative analysis using an EPMA in an area within the first Al plate at a position 0.2 mm away from the heat discharge plate on the first Al plate side are within the following ranges: 0.05 percent by weight$\leq Si \leq$3.0 percent by weight when the brazing material is Al—Si based; 0.05 percent by weight$\leq Cu \leq$2.0 percent by weight when the brazing material is Al—Cu based; 0.05 percent by weight$\leq Mg \leq$2.0 percent by weight when the brazing material is Al—Mg based; 0.05 percent by weight$\leq Mn \leq$1.0 percent by weight when the brazing material is Al—Mn based; and 0.05 percent by weight$\leq Ge \leq$3.0 percent by weight when the brazing material is Al—Ge based. As a result of the above, a sufficient bond strength is obtained and it is possible to effectively prevent the bonded surfaces of the insulated circuit board and the heat discharge plate from peeling away from each other due to stress arising from the expansion and contraction caused by the heating cycle.

Furthermore, in the above described power module, if the length of one side of the insulated circuit board is made 30 mm or less, and the thickness of the heat discharge plate is set to between 3 and 10 mm, it is possible to restrict to a comparatively small level disparities in the shrinkage at the edge of the insulated circuit board that are based on disparities in the thermal coefficient of contraction of the heat discharge plate and the insulated circuit board. Moreover, because it is possible to inhibit any marked warping in the heat discharge plate, peeling caused by the shrinking that accompanies heating and cooling can be prevented, and the heat cycle longevity can be extended.

Note that the present invention may be achieved using a variety of configurations insofar as they do not depart from the main features of the present invention. The above described embodiments serve as examples of the present invention and it is to be understood that the present invention is in no way limited by the above described embodiments.

In addition, the range of the present invention is indicated by the range of the claims and is not constrained by the description in the specification. Moreover, variations and alterations that are within a range equivalent to that of the claims are all within the range of the present invention.

What is claimed is:

1. A power module in which one or two or more square insulated circuit boards are fixed to one main surface of a heat discharge plate, wherein
   the heat discharge plate is an Al alloy plate having a thickness of 3 to 10 mm, and
   the insulated circuit board has a side with a length of 30 mm or less and is brazed directly onto the heat discharge plate.

2. The power module according to claim 1, wherein the brazing material used is one or two or more brazing materials selected from Al—Si, Al—Ge, Al—Cu, Al—Mg, and Al—Mn based brazing materials.

3. The power module according to claim 1 or 2, wherein the insulated circuit board is provided with a ceramic substrate formed of $Si_3N_4$, AlN, or $Al_2O_3$ and with first and second Al plates that are bonded to both surfaces of the ceramic substrate, and the first or second Al plate that is brazed to the heat discharge plate has a purity of 99.98 or greater percent by weight.

4. The power module according to claim 1 or 2, wherein the insulated circuit board is provided with a ceramic substrate formed of $Si_3N_4$, AlN, or $Al_2O_3$ and with an Al plate that is bonded to one surface of the ceramic substrate, and another surface of the ceramic substrate is brazed directly onto the heat discharge plate.

5. The power module in which another main surface of the heat discharge plate of the power module according to any of claim 1 or 2 is joined to a water cooled or air cooled heat sink formed of an Al based alloy.

6. The power module according to claim 5, wherein the heat sink is provided with a heat sink main body in which is formed a coolant passage and with a lid body that is joined to the heat sink main body so as to cover and seal the coolant passage, and the heat discharge plate of the power module is structured so as to be able to also function as the lid body.

7. A power module in which one or two or more square insulated circuit boards are fixed to one main surface of a heat discharge plate, wherein
   the insulated circuit board is provided with a ceramic substrate formed of $Si_3N_4$, AlN, or $Al_2O_3$ and with first and second Al plates that are bonded to both of the ceramic substrate,
   the first Al plate of the insulated circuit board is brazed using one or two or more brazing materials selected from Al—Si, Al—Ge, Al—Cu, Al—Mg, and Al—Mn based brazing materials directly to the heat discharge plate alloy plate, and
   the average values of component contents of Si, Cu, Mn, and Ge measured by performing 5 point quantitative analysis using an EPMA in an area within the first Al plate at a position 0.2 mm away from the heat discharge plate on the first Al plate side are within the following ranges:
   0.05 percent by weight$\leq Si \leq$3.0 percent by weight when the brazing material is Al—Si based;
   0.05 percent by weight$\leq Cu \leq$2.0 percent by weight when the brazing material is Al—Cu based;
   0.05 percent by weight$\leq Mg \leq$2.0 percent by weight when the brazing material is Al—Mg based;
   0.05 percent by weight$\leq Mn \leq$1.0 percent by weight when the brazing material is Al—Mn based; and 0.05 percent by weight≦Ge≦3.0 percent by weight when the brazing material is Al—Ge based.

8. The power module according to claim 7, wherein the heat discharge plate is an Al based alloy plate having a thickness of 3 to 10 mm, and the insulated circuit board has a side with a length of 30 mm or less.

9. A power module in which one or two or more square insulated circuit boards are fixed to one main surface of a heat discharge plate, wherein the insulated circuit board is provided with a ceramic substrate formed of $Si_3N_4$, AlN, or $Al_2O_3$ and with first and second Al plates that are bonded to both surfaces of the ceramic substrate, the first Al plate of the insulated circuit board is brazed using one or two or more brazing materials selected from Al—Si, Al—Ge, Al—Cu, Al—Mg, and Al—Mn based brazing materials, directly to the heat discharge plate formed by an Al based alloy plate, and a layer formed by the brazing material is not visible at a portion where the heat discharge plate is bonded to the first Al plate even when a scanning electron microscope image of a magnification of 1000 times or more is used.

* * * * *